United States Patent [19]

Feller

[11] Patent Number: 4,599,251

[45] Date of Patent: Jul. 8, 1986

[54] DECORATED ARTICLE, METHOD OF FABRICATING THE SAME AND SUBSTRATES USED IN CONNECTION THEREWITH

[75] Inventor: Gilbert Feller, Le Locle, Switzerland

[73] Assignee: Metalem S.A., Le Locle, Switzerland

[21] Appl. No.: 621,869

[22] Filed: Jun. 18, 1984

[30] Foreign Application Priority Data

Jun. 23, 1983 [FR] France ................ 83 10412

[51] Int. Cl.⁴ .................... B32B 3/00; B32B 9/04; B05D 5/06
[52] U.S. Cl. .................... 428/156; 427/162; 427/214; 428/195; 428/201; 428/203; 428/336; 428/447; 428/448
[58] Field of Search .............. 428/446, 447, 195, 201, 428/203, 156, 448; 427/93, 94, 162, 214

[56] References Cited

U.S. PATENT DOCUMENTS 4,472,240  9/1984  Kameyama ................ 427/93 X
4,499,147  2/1985  Enomoto et al. ........... 428/446 X

*Primary Examiner*—Thomas J. Herbert
*Attorney, Agent, or Firm*—Werner W. Kleeman

[57] ABSTRACT

The decorated article, for instance an instrument dial or watch dial, article of jewelry or ornamented article of use, possesses at least one surface or decorative layer which, in the presence of reflected light, appears to be colored, for instance yellow, red, blue or gray. This surface or decorative layer is formed by a silicon substrate or substratum, or lower layer as well as an upper or top layer fixedly connected thereto, for instance, connected by a reaction and/or deposition with the substratum. This top layer is permeable for optical light and comprises a silicon compound, preferably silicon dioxide, which under standard conditions is solid and practically inert, and has a thickness sufficient for interference-color formation, typically in the range of 50–1000 nm, preferably 90–500 nm. The surface or decorative layer can constitute the decorated article itself, for instance an instrument dial or watch dial or can be part of a decorated article, for instance a cigarette lighter.

22 Claims, 2 Drawing Figures

DECORATED ARTICLE, METHOD OF FABRICATING THE SAME AND SUBSTRATES USED IN CONNECTION THEREWITH

BACKGROUND OF THE INVENTION

The present invention relates to a new and improved decorated or ornamented article, to an improved method of fabricating such decorated articles, and to the use of silicon substrates coated with silicon compounds and serving as the decorated article or for use with the decorated article.

As is well known very thin optical transparent layers in reflected light appear to the eye, owing to interference phenomena, as colored, although the layers consist of practically colorless material. Examples of such phenomena are the color effects of soap bubbles or mother-of-pearl and similar inorganic materials (opal) which are conventionally used for the fabrication of decorative or ornamental articles. There are furthermore known the so-called annealing or tempering colors which arise upon heating of iron alloys and which are predicated upon the formation of oxide layers. The thickness of such oxide layers is dependent upon the momentarily employed "annealing temperature", and which oxide layers appear to be colored ("annealing colors") when viewing the same in reflected light, without in reality being so inasmuch as the mass of the layer material is colorless.

Typical in this regard is, for instance, the cyaneous color of watch springs, i.e., the interference color of a thin layer of iron oxide which forms at annealing temperatures of 295° C. upon the metallic base or matrix material and having a thickness less than 100 nanometers (nm). Such annealing colors, generally, however, do not have any decorative functions, rather are the incidental consequence of temperature treatments for obtaining certain material properties.

For the fabrication of decorative or ornamental articles there were hardly suitable the conventional annealing color layers of substrates formed of iron alloys in comparison to the conventional lacquer- or colored layers because of their comparatively high corrosion sensitivity, their relatively low mechanical strength (scratch sensitivity) and, in particular, due to the difficulties in producing reproduceable color effects.

SUMMARY OF THE INVENTION

Therefore, with the foregoing in mind it is a primary object of the present invention to provide a new and improved decorative article and a method of fabricating the same which is not associated with the aforementioned drawbacks and limitations heretofore discussed.

Another important object of the present invention aims at providing silicon substrates coated with silicon compounds and serving as the decorated article or for use in the decorated article.

Another important object of the present invention is to provide a surface or decorative layer which is suitable for use with decorated articles and appears colored in reflected light, this surface or decorative layer possessing high chemical resistance, allows for the color formation with good reproduceability and which is superior as concerns mechanical strength, temperature and aging resistance in comparison to the conventional organic and inorganic decorative layers heretofore known for decorative purposes.

It has been surprisingly found according to the invention that different methods heretofore known from the semiconductor technology for the formation of layers which are well defined as concerns composition and thickness, these layers being formed of silicon compounds and deposited upon silicon substrates are beneficially suitable for use for fabricating colored-appearing layers employable for decorative purposes and which fulfill the aforementioned objectives.

Under the term "decorative articles" or similar expressions as used herein, there is not simply to be understood typically articles of jewelry, but also other articles of use of the most various types which possess at least one surface having a colored appearance, which can be structured of a single or multi-colors and can possess image-, written-, or pattern-like contrasts.

The inventive decorated or ornamental article possesses at least one surface, also referred to as a decorative layer, which appears to be colored in reflected light (daylight or polychromatic artificial light). This colored-appearing surface or decorative layer can be constructed to be flat, curved, domed or profiled and can possess a uniform or polyform and, if desired, image- and/or written- and/or pattern-type contrasted appearance.

The inventive article is manifested by the features that the at least one surface or decorative layer, which in reflected light appears to be colored, for instance yellow, red, blue or gray, is formed by a silicon substrate or lower layer and an upper or top layer rigidly or fixedly connected with the substrate or lower layer and produced, for instance, reactively and/or depositively. This top or upper layer is permeable to optical light and consists of a silicon compound which under standard or normal conditions is solid, practically inert and preferably colorless. The silicon compound, in particular, may be silicon dioxide. This top or upper layer has a thickness adequate for interference-color formation, typically in the range of 50–1000 nm, preferably 90–500 nm.

The decorated article, for instance the dial of a watch or an article of jewelry, can practically totally consist of the decorated layer, i.e., a self-supporting silicon substrate, the decoration of which at least partially consists of the top or upper layer displaying the interference colors. Such may be, for instance, in the form of a uniform or pattern-like or irregular colored surface upon which there can be produced ornamental patterns or the usual markings, for instance formed of opaque material, by imprinting or vapor deposition or in any other suitable manner, for instance by thickness differences of the top layer.

The decorated article can, however, also consist of materials other than silicon. This decorated article can possess at least at one outer surface a decorative layer in the form of the silicon substrate which is applied by soldering, adhesive bonding or in some other suitable fashion. This decorative layer in conjunction with the top or upper layer formed of the silicon compound forms the desired uniform or polyform decoration.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
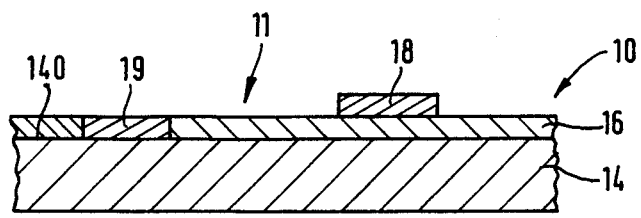
FIG. 1 schematically illustrates a first exemplary embodiment of the surface structure of an article produced according to the invention.

Describing now the drawings, in FIG. 1 there has been shown schematically in fragmentary and markedly enlarged sectional view a decorated or ornamental article 10, the surface 11 of which, also referred to as the decorative or decorated layer, appears colored in reflected light. This decorated article 10 is formed by a lower or base layer 14—also referred to as a substrate—composed of elementary silicon, for instance a self-supporting silicon plate or disc formed of technically obtained silicon. A particularly great purity of the silicon of the layer or substrate 14 is not required but also not disadvantageous. Generally, the silicon used as the base or matrix material for the production of semiconductors is suitable, and such silicon can be mono- or polycrystalline. The silicon substrate 14 has, for instance, a thickness of 0.05–5 mm or greater.

Figure 2:
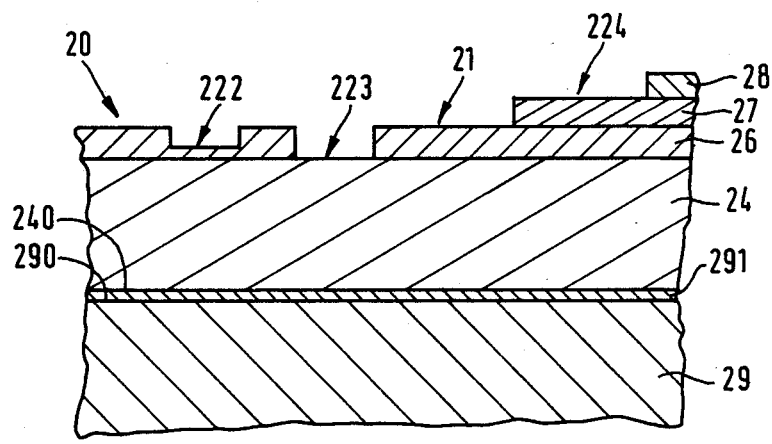
FIG. 2 schematically illustrates a further embodiment of the surface structure of the inventive article.

When the silicon substrate 14, for instance as explained in conjunction with FIG. 2, is secured to a carrier formed of a different material, then the silicon substrate or layer 14 need not be self-supporting and then can be constructed to be correspondingly thinner. It is, if necessary, to be observed that during the reactive fabrication of the top or upper layer 16, as will be explained more fully hereinafter, for instance by oxidation ($SiO_2$) at elevated temperatures, part of the base layer is consumed, for instance 0.1 nm Si for each 0.2 nm $SiO_2$, and that in this regard a certain minimum thickness of the substrate or layer 14 must be ensured for.

At least the upper surface 140 of the substrate 14 is preferably smoothed in conventional manner, either mechanically or in some other appropriate fashion, in order to produce a dull or polished surface quality. This is done so that there can be obtained upper or top surfaces corresponding to those realized during the fabrication of semiconductor elements according to conventional methods for applying or forming layers having usually well defined composition and thickness upon silicon substrates. The surface quality (dull or polished) of the top layer 16 generally corresponds to that of the substrate or lower layer 14.

For technological and economical reasons there are preferably employed for the invention usually upper or top layers 16 formed of silicon dioxide. However, there are basically suitable also upper or top layers 16 formed of other silicon compounds which are pervious for optical light, i.e., those which, as layers, have the thickness needed for the interference-color formation and are practically glass clear and possess at most a low inherent color; preferably the light permeability of the layer in the presence of throughpassing light amounts to more than 90%, i.e., the layer formed of the silicon compound, as the insulating layer, should absorb preferably less than 10% of the throughpassing light. However, at a top or upper layer 16 located upon the opaque lower layer or substrate 14 also appreciably more than 10% of the incident light can become lost due to reflection losses at the boundary layer or interface, without there thus being eliminated the formation of interference colors in the upper layer 16.

This upper layer 16 consists of a silicon compound which is solid and generally practically inert in the sense that under standard or normal conditions of use and fabrication it is thermally and chemically stable. In other words, it does not significantly alter, for instance, either under the action of water or in the presence of temperatures up to 100° C. Examples of such type of silicon compounds are, apart from the oxides, the nitrides and carbides of silicon. Silicon dioxide is particularly preferred for reasons of its low costs.

As is well known layers formed of silicon compounds can be reactively formed upon silicon substrates. In other words, due to the chemical reaction of the silicon base or matrix material in situ with the required reaction partner or partners which are present in an elementary or elemental form or as compounds and preferably present in each case in the form of a gas. Layers formed of silicon compounds can however be depositively formed, i.e. by deposition techniques, such as vapor deposition, while employing pre-formed compounds.

The details of such suitable methods are well known in the art and in the relevant publications, for instance Meissel and Glang, Handbook of Thin Film Technology. Generally, there are preferred for the purposes of the present invention reactive methods which can be accomplished with acceptable technological expenditure for the formation of transparent layers formed of silicon compounds. A preferred examples is the conversion of the substrate-silicon with oxygen, wherein the activation energy can be delivered thermally, for instance by heating and/or electrically, for instance by glow discharge. It is possible to heat, for instance, the silicon substrate in the presence of oxygen or an oxygen-containing gas, such as air, under defined conditions of pressure, humidity and the like, to reaction temperatures exceeding 500° C.

Generally, there are technically obtainable silicon substrates having cover or protective layers formed of defined silicon compounds, such as $SiO_2$, of suitable thickness as the base material for the semiconductor fabrication. The thickness of the top or upper layer 16, adequate for the interference-color formation, is, as above mentioned, usually in the range of 50–1000 nm. The suitable or optimum thickness of the layer 16, for a certain interference color, can be influenced by the specific optical properties, such as index of refraction, optical thickness, turbidity and the like, i.e., both from the nature of the silicon compound of the layer 16 and also from the method used for the layer formation.

As exemplary embodiments there are hereinafter mentioned the following values for the color/thickness correlation of transparent $SiO_2$-layers:

| Interference Color | Layer Thickness in nm |
|---|---|
| brown-white | 68.5 |
| light brown | 73.3 |
| dark brown | 79.5 |
| reddish-brown | 85.0 |
| purple | 88.4 |
| dark violet | 92.5 |
| dark blue | 95.9 |
| light blue | 112.0 |
| pale green | 176.0 |
| light yellow | 193.0 |
| golden yellow | 206.0 |
| orange colors | 241.0 |
| red | 255.0 |
| dark purple colors | 265.0 |
| dark violet | 274.5 |
| dark blue | 277.9 |

| Interference Color | Layer Thickness in nm |
| --- | --- |
| light blue | 294.0 |
| pale green | 358.0 |
| light yellow | 375.0 |
| golden yellow | 388.0 |
| orange colors | 423.0 |
| red | 437.0 |
| dark purple colors | 447.0 |

The interference color/thickness relationship or ratio, as is well known, is dependent upon the wavelength $\lambda$ of the incident light, wherein the interference effects particularly arise at $\lambda/4$, $\lambda/2$, $\lambda/1$. Therefore, there can be realized a desired color with different thicknesses of the layer 16. Interference boundary regions for $SiO_2$ lie at, for instance, 91, 273, 455, 637, 819 and 1002 nm.

It should be understood that an exact measurement of the layer thickness is basically not critical or necessary, and in practice can be replaced or augmented by color comparison. Furthermore, the thickness of the top or upper layer 16 can be enlarged either by prolonged or intensified conditions of the reaction formation or deposition formation of the layer, or by controlled layer material removal methods, such as, for instance, etching, can be reduced over the entire area or in certain partial regions and the color effect in each case can be altered.

The upper layer 16 can be provided with locally defined or limited overlays or coatings 18 formed or consisting of optically impervious (opaque) material, for instance from printing ink, metals, enamel and so forth, according to known techniques such as printing (for instance silk screen printing), vapor deposition (vacuum coating), adhesive bonding, painting-on and so forth, with or without the use of known masks, such as for instance photo lacquers. This is done, for instance, to form at an instrument dial of measuring devices, displays, watches and so forth, appropriate reference or luminous points, written markings, numbers and so forth.

Alternatively, the substrate layer 14 can be provided with metallic coatings or overlays already prior to the formation of the top or upper layer 16, for instance by vapor deposition at certain regions (while utilizing appropriate masks or temporary protective layers) and thereafter can be treated for the formation of the top or upper layer 16 where the overlays or coatings then appear as inserts 19. In this case the top or upper layer 16 must be formed under conditions wherein the material or metal of the inserts 19 does not experience any disadvantageous alteration.

Generally, in conjunction with FIGS. 1 and 2 it should be underscored that the momentary layer thickness or layer thickness relationships do not correspond in scale in any way to reality.

In FIG. 2 there is depicted, similar to FIG. 1, a schematically illustrated, fragmentary sectional view of the top or upper surface of a decorated article 20. The substrate or lower layer 24 formed of silicon carries at a first region 21 the interference-color layer 26 formed of a silicon compound as above explained, preferably $SiO_2$. The top or upper layer 26 is of thinner construction in a second region 222 and 223, respectively. Under circumstances this can be realized by appropriately covering the relevant regions during the formation of the layer 26, but preferably can be accomplished by subsequent material removal, for instance according to the usual chemical etching methods with appropriate covering or masking of the regions which are not to be etched. The localized material removal of the layer 26 can lead to a partial layer removal (region 222) or a complete layer removal (region 223) while exposing and, if desired, etching the silicon base or matrix material.

The second partial region can, however, also be formed, as indicated by reference character 224, by a second or thicker applied interference-color layer 27. In each case, i.e., both when reducing the thickness of or removing parts of the layer 26 as well as also by accomplishing its localized intensification or material build-up or overlay, there can be obtained an optically discernable contrast between the first partial region 21 and the second partial region or the second partial regions 222, 223, 224. Once again, a coating or overlay 28 formed or consisting of opaque material can lie directly, as shown in FIG. 1, or indirectly, by means of the thickened layer region 224, upon the layer 26, in order to render possible additional contrasts with decorative and/or informational characters or the like.

With the decorated or ornamented articles 20, the surfaces of which normally are not composed of silicon, for instance decorated articles of use, such as cigarette lighters, it is possible, as already explained, to secure the silicon substrate 24 upon a surface 290 of the article which constitutes a carrier not composed of elementary silicon, for instance, by means of a solder or adhesive layer 291 or by other known fixation techniques, such as screws or rivets.

The advantages of the inventively decorated articles reside in the good reproduceability of the interference colors of the layers 16, 26, the comparatively low costs of the materials and their processing, the outstanding mechanical and chemical resistance of layers formed of solid silicon compounds, such as silicon dioxide having a typical MOHS-hardness of 7, their resistance to light as well as the comparatively high thermal resistance of such layers. Such factors render possible both their use under comparatively extreme conditions and also simplifies the processing operations, for instance soldering to the carrier or support 29.

For instance, the underside 240 of the silicon layer 24 can be provided with a layer 291 of a solder metal, for instance by bath-coating or vapor deposition, and can be heated to the soldering temperature for the purpose of connection with the carrier or support 29 without the need for any special protective measures.

Conventional soft solder temperatures do not have any deleterious effect upon the color layer 26, since for the oxidation of silicon by heating in air higher temperatures would be necessary. If desired, for the thermal bond or connection with the carrier or support 29 there can be employed higher temperatures (hard soldering) in the presence of an inert gas, such as helium or argon. In the presence of oxygen or air silicon is normally first oxidized at temperatures exceeding 700° C. Typical temperatures for the reactive formation of layers 16, 26 of silicon oxide by heating of elementary silicon in air lie in a range of 700° C. up to the melting point of silicon (1414° C.), preferably at most 1380° C. and, in particular, between 900° C. and 1100° C. with a typical heating duration of 30 to 60 minutes.

A noteworthy advantage of the invention is the lesser contamination of the environment during the production process in comparison to conventional methods, such as galvanizing.

Examples of the inventively decorated articles of use or articles of jewelry are, for instance: pens, ball-point pens, lead pencils, toilet and hand mirrors, powder compacts, cartridges or sleeves for lipsticks and other cosmetic articles, watch cases and arm bands, articles of jewelry, such as broaches, pendants, cuff links, tie clips, jewelry boxes, arm bands, necklaces, earrings, toilet articles, such as makeup-pencil cartridges, perfume holders, pocket or hand mirrors, pocket or hand hairbrushes, shaving apparatuses and brushes, manicure devices and further articles of use, such as cigarette lighters, key rings and containers, writing devices, cigarette cases, religious artifacts, writing articles, vases, pots, saucers, table supports, lamps, candle holders, mosaics and mosaic parts, furniture, inlaid work (marquetry), game tables and boards and numerous other articles, which can require one or a number of pronounced decorations which are wear and aging resistant.

While there are shown and described present preferred embodiments of the invention, it is to be distinctly understood that the invention is not limited thereto, but may be otherwise variously embodied and practiced within the scope of the following claims.

Accordingly, what I claim is:

1. A decorated article comprising:
    at least one surface which appears colored in reflected light;
    said colored-appearing surface comprising a silicon substrate and an upper layer formed on and fixedly connected with the substrate;
    said upper layer being pervious to optical light and comprising a solid silicon compound which is practically inert under standard conditions and which is selected from the group essentially consisting of silicon carbide, silicon dioxide, silicon nitride; and
    said solid silicon compound possessing an interference-color producing thickness.
    said upper layer has at a first surface region thereof a first thickness sufficient for forming an interference-color and at a second surface region thereof a second thickness which imparts optical properties to the second surface region which are sufficiently different from those of the first surface region for generating a contrast which can be discerned with human eye.

2. The decorated article as defined in claim 1, wherein:
    said decorated article essentially consists of the silicon substrate and the upper layer as well as coatings or inserts.

3. The decorated article as defined in claim 1, wherein:
    the upper layer possesses variable thickness.

4. The decorated article as defined in claim 1, further including:
    a carrier formed of a material other than silicon and to which there is secured the silicon substrate.

5. The decorated article as defined in claim 1, wherein:
    said upper layer is provided at least at regions thereof with a coating consisting of opaque material.

6. The decorated article as defined in claim 1, wherein:
    said upper layer is provided at least at regions thereof with an insert consisting of opaque material.

7. The decorated article as defined in claim 1, wherein:
    said second surface region is arranged in a pattern-like orientation.

8. The decorated article as defined in claim 1, wherein:
    said second surface region is arranged in a image-like orientation.

9. The decorated article as defined in claim 1, wherein:
    said second surface region is arranged in a written-like orientation.

10. The decorated article as defined in claim 1, wherein:
    said upper layer formed of the silicon compound comprises an essentially glass clear practically colorless mass.

11. The decorated article as defined in claim 1, wherein:
    said upper layer formed of the silicon compound has a thickness in the range of about 50–1000 nm.

12. A method of fabricating a decorated article, comprising the steps of:
    applying to at least one surface region of a carrier a silicon layer as substrate and an upper layer formed on and fixedly connected with such silicon layer;
    the upper layer being pervious to optical light, composed of a solid silicon compound which is practically inert under standard conditions, which is selected from the group essentially consisting of silicon carbide, silicon dioxide, silicon nitride, and which has an interference-color producing thickness; and
    depositing or removing preselected regions of the upper layer in order to produce a visible contrast between a first interference-color producing surface region and a second surface region possessing other interference colors.

13. The method as defined in claim 12, wherein:
    said upper layer essentially consists of silicon dioxide which is formed reactively by the conversion of the substrate with oxygen.

14. The method as defined in claim 12, further including the steps of:
    depositing or removing preselected regions of the upper layer in order to produce a visible contrast between a first interference-color producing surface region and a second surface region possessing other interference colors.

15. The method as defined in claim 12, wherein:
    the substrate composed of silicon also constitutes the carrier of the article.

16. The method as defined in claim 12, wherein:
    the substrate composed of silicon is secured to a surface of a carrier composed of a material other than silicon.

17. The method as defined in claim 12, further including the steps of:
    prior to forming the upper layer, smoothing a preselected surface of said substrate in order to produce a surface roughness which possesses a dull appearance; and
    thereafter forming a smooth upper layer having a dull appearance.

18. The method as defined in claim 12, further including the steps of:
    providing the upper layer at regions thereof with a coating consisting of an opaque material.

19. The method as defined in claim 18, wherein:
    the coating of the opaque material is a metal coating.

20. The method as defined in claim 12, further including the steps of:
   providing the upper layer at regions thereof with an insert consisting of an opaque material.

21. The method as defined in claim 20, wherein:
   the insert consisting of the opaque material is a metal insert.

22. A method of fabricating a decorated article, comprising the steps of:
   applying to at least one surface region of a carrier a silicon layer as substrate and an upper layer formed on and fixedly connected with such silicon layer;
   the upper layer being pervious to optical light, composed of a solid silicon compound which is practically inert under standard conditions, which is selected from the group essentially consisting of silicon carbide, silicon dioxide, silicon nitride, and which has an interference-color producing thickness;
   prior to forming the upper layer, smoothing a preselected surface of said substrate in order to produce a surface roughness which possesses a polished appearance; and
   thereafter forming a smooth upper layer having a polished appearance.

* * * * *